United States Patent
Zhou (10) Patent No.: US 9,515,102 B2
(45) Date of Patent: Dec. 6, 2016

(54) ARRAY SUBSTRATE AND METHOD FOR PRODUCING THE SAME, DISPLAY SUBSTRATE AND DISPLAY APPARATUS

(71) Applicant: BOE Technology Group Co., Ltd., Beijing (CN)

(72) Inventor: Weifeng Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/646,866

(22) PCT Filed: Sep. 17, 2014

(86) PCT No.: PCT/CN2014/086676
§ 371 (c)(1),
(2) Date: May 22, 2015

(87) PCT Pub. No.: WO2015/176428
PCT Pub. Date: Nov. 26, 2015

(65) Prior Publication Data
US 2016/0268318 A1    Sep. 15, 2016

(30) Foreign Application Priority Data
May 22, 2014   (CN) .......................... 2014 1 0217686

(51) Int. Cl.
*H01L 29/15*   (2006.01)
*H01L 27/12*   (2006.01)

(52) U.S. Cl.
CPC ......... *H01L 27/1266* (2013.01); *H01L 27/124* (2013.01); *H01L 27/1218* (2013.01)

(58) Field of Classification Search
CPC .. H01J 1/304; H01L 2/1266; H01L 27/1218; H01L 27/1247; H01L 27/124; H01L 27/1266
See application file for complete search history.

(56) References Cited

U.S. PATENT DOCUMENTS

| 4,764,413 A | 8/1988 | Nukii et al. |
| 7,102,223 B1 * | 9/2006 | Kanaoka ............. H01L 23/3114 257/698 |

(Continued)

FOREIGN PATENT DOCUMENTS

| CN | 101996535 A | 3/2011 |
| CN | 102568377 A | 7/2012 |

(Continued)

OTHER PUBLICATIONS

International Search Report and Written Opinion for PCT Application No. PCT/CN2014/086676, dated Feb. 27, 2015, 10 pages.

(Continued)

*Primary Examiner* — Yosef Gebreyesus (74) *Attorney, Agent, or Firm* — Westman, Champlin & Koehler, P.A.

(57) ABSTRACT

The present disclosure provides an array substrate, a method for producing the same, a display panel and a display apparatus. The array substrate comprises: a glass substrate; a flexible substrate comprising a first region and a second region, the glass substrate being supported on a lower surface of the first region of the flexible substrate and the second region projecting from the first region towards the external of the glass substrate; a display array formed on the first region of the flexible substrate; and a peripheral circuit formed on the second region of the flexible substrate. The array substrate can achieve a display apparatus with super narrow frame, even without frame.

18 Claims, 4 Drawing Sheets

(56) References Cited

U.S. PATENT DOCUMENTS

| | | | |
|---|---|---|---|
| 8,724,038 B2 | 5/2014 | Ganapathi et al. | |
| 8,743,082 B2 | 6/2014 | Ganapathi et al. | |
| 2007/0040981 A1 | 2/2007 | Iwanaga et al. | |
| 2010/0060841 A1* | 3/2010 | Shinn | H05K 3/323 349/150 |
| 2013/0072079 A1* | 3/2013 | Tang | G02F 1/133351 445/24 |

FOREIGN PATENT DOCUMENTS

| | | |
|---|---|---|
| CN | 102636898 | 8/2012 |
| CN | 103168283 A | 6/2013 |
| CN | 103558703 | 2/2014 |
| CN | 103594485 | 2/2014 |
| CN | 104009044 A | 8/2014 |
| TW | M455211 U1 | 6/2013 |
| WO | WO 2014/073504 | 5/2014 |

OTHER PUBLICATIONS

English translation of Box. No. V of Written Opinion, 3 pages.
Office Action from Chinese Patent Application No. 201410217686.X, dated Apr. 22, 2016.
Copy of second Office Action, including Search Report, for Chinese Patent Application No. 201410217686.X, dated Sep. 14, 2016, 20 pages.

* cited by examiner

ARRAY SUBSTRATE AND METHOD FOR PRODUCING THE SAME, DISPLAY SUBSTRATE AND DISPLAY APPARATUS

CROSS-REFERENCE TO RELATED APPLICATION

This Application is a Section 371 National Stage Application of International Application No. PCT/CN2014/086676, filed 17 Sep. 2014, which has not yet published, and claims priority to Chinese Patent Application No. 201410217686.X, filed on 22 May 2014, in Chinese, the contents of which are hereby incorporated by reference in their entirety.

BACKGROUND OF THE INVENTION

Field of the Invention

The present disclosure relates to an array substrate and a method for producing the same, a display substrate and a display apparatus.

Description of the Related Art

In current display productions, Fanout, chip on glass (COG), flexible printed circuit (FPC) Pad have to be produced on a glass substrate. In this way, the frame will have to be kept above 1 mm even if a narrow frame design such as GOA (Gate driver On Array) is used sufficiently. It cannot achieve a super narrow frame or eliminate the frame.

SUMMARY OF THE INVENTION

In view of this, the present disclosure provides an array substrate and a method for producing the same, a display panel and a display apparatus which may achieve the production of a display apparatus with a super narrow frame, even without frame.

In accordance with an aspect, it provides an array substrate comprising:

a glass substrate;

a flexible substrate comprising a first region and a second region, the glass substrate being arranged on a lower surface of the first region of the flexible substrate and the second region projecting from the first region towards the external of the glass substrate, the second region of the flexible substrate being provided with a peripheral circuit thereon; and a display array formed on the first region of the flexible substrate.

In an embodiment, the first region of the flexible substrate is overlapped totally with the glass substrate and the second region of the flexible substrate bends with respect to the glass substrate.

In an embodiment, the glass substrate supports a middle part of the flexible substrate, an edge portion of the first region and the second region of the flexible substrate bend with respect to the glass substrate.

In an embodiment, the part in which the peripheral circuit is not produced on the second region of the flexible substrate has at least one discontinuous area.

In an embodiment, the at least one discontinuous area is located at the extending positions of four corners of the glass substrate.

In an embodiment, the at least one discontinuous area has a shape of right angled quadrilateral formed by crossing extensions of two adjacent sides of the glass substrate.

In an embodiment, the flexible substrate comprises one or more of polyimide, polycarbonate, polyethylene glycol terephthalate, polyarylester, polyether sulphone, or polyethylene naphthalate or the combination thereof.

In an embodiment, the array substrate further comprises:

a releasing layer located between the glass substrate and the flexible substrate and comprises a material which is able to gasify by absorbing laser energy.

In an embodiment, the releasing layer is made from one or more of poly(p-xylene), metal oxide, SINx, SiO$_2$, amorphous silicon, III and V Group semiconductor, or hexamethyl disilazane or the combination thereof.

In an embodiment, the array substrate is further provided with a flexible circuit board which is partly attached to an edge of the second region of the flexible substrate and a driving chip which is attached to the second region of the flexible region and electrically connected to the peripheral circuit.

In an embodiment, the array substrate is further provided with a flexible circuit board which is partly attached to an edge of the second region of the flexible substrate, the flexible circuit board being provided with a driving chip thereon, the driving chip being electrically connected to the peripheral circuit.

In accordance with a second aspect, it provides a display substrate comprising the array substrate according to any one of the above embodiments.

In accordance with a third aspect, it provides a display apparatus comprising the display substrate as described above.

In accordance with a fourth aspect, it provides a method for producing an array substrate, the method comprising:

forming a flexible substrate on a glass substrate;

forming a display array and a peripheral circuit on the flexible substrate, the flexible substrate comprising a first region in which the display array is located and a second region in which the peripheral circuit is located, the second region being the region on the flexible substrate other than the first region;

cutting the glass substrate along an edge of the first region formed with the display array;

separating the part of the glass substrate which is not covered by the first region from the flexible substrate.

In an embodiment, the method further comprises: before forming the flexible substrate, forming a releasing layer on the glass substrate and forming the flexible substrate on the releasing layer, the releasing layer comprising a material which is able to gasify by absorbing laser energy.

In an embodiment, the releasing layer is formed on an entire surface of the glass substrate, or only formed on a surface of the part of the glass substrate to be cut off.

In an embodiment, the part of the glass substrate which is not covered by the first region from the flexible substrate is separated by means of laser irradiation.

In an embodiment, the method further comprises: cutting the part in which the peripheral circuit is not produced on the second region of the flexible substrate to form at least one discontinuous area on the second region.

In the embodiment of the present invention, a layer of flexible substrate is produced on the glass substrate, and a display array and a peripheral circuit are produced on the flexible substrate, and such as a driving chip, a flexible circuit board are arranged on the flexible substrate, then the part of the glass substrate out of the display region is removed by cutting and laser separation. When the display panel is assembled, the lead region of the display array and the attached elements such as driving chip, flexible circuit board and printed circuit board produced on the flexible substrate may bend to the backside of the display screen, such that the production of a display apparatus with a super narrow frame, even without frame can be achieved.

REFERENCE NUMERALS 101 glass substrate 102 flexible substrate 103 display array
104 peripheral circuit 105 flexible circuit board 106 driving chip
107 printed circuit board
1021 first region 1022 second region 1023 discontinuous area
301 glass substrate 302 flexible substrate 303 display array
304 peripheral circuit
3021 first region 3022 second region 3023 discontinuous area

DETAILED DESCRIPTION OF EMBODIMENTS OF THE INVENTION

In order that the objects, technical solutions and advantages of the present disclosure become more apparent, the embodiments of the present invention will further be explained below with reference to attached figures.

Figure 1A:
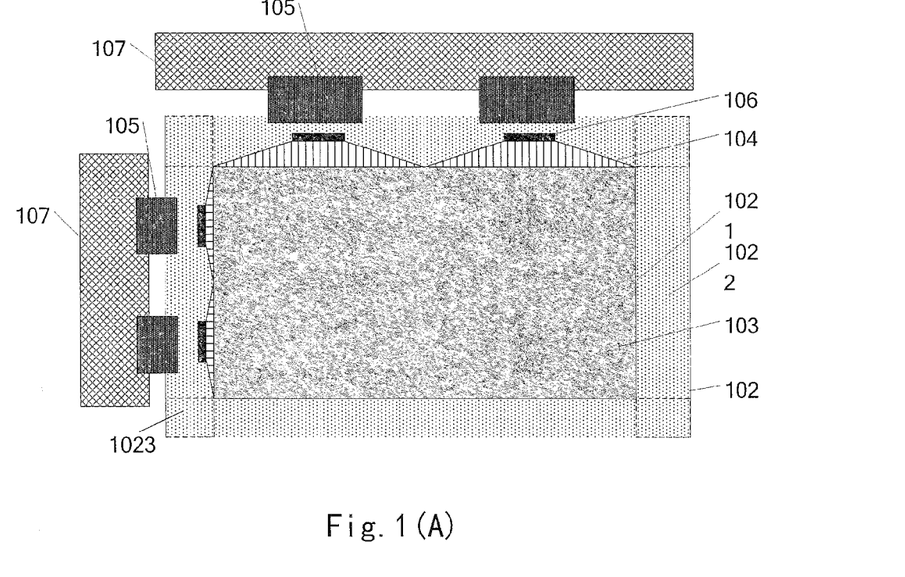
FIG. 1(A)-FIG. 1(B) are structural schematic views of an array substrate according to the present disclosure.
Figure 1B:
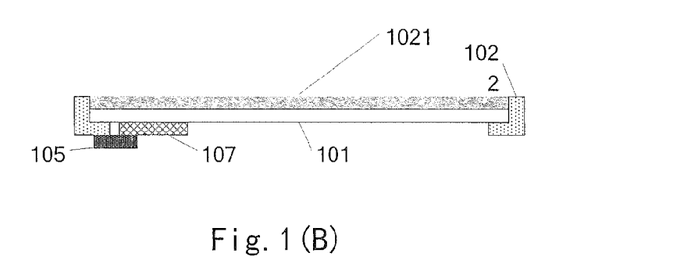

FIG. 1(A)-FIG. 1(B) are structural schematic views of an array substrate according to the present disclosure. FIG. 1(A) is a schematic plan view of the array substrate. FIG. 1(B) is a schematic cross sectional view of the array substrate. As illustrated in FIG. 1(A)-FIG. 1(B), the array substrate includes:

a glass substrate 101;

a flexible substrate 102 which is arranged on an upper surface of the glass substrate 101 and includes a first region 1021 and a second region 1022, the first region 1021 being a display region for producing the display array, the glass substrate 101 being arranged on a lower surface of the first region 1021 and being supported by the glass substrate 101, the second region 1022 being a peripheral region other than the display region and projecting from the first region 1021 towards the external of the glass substrate 101;

a display array 103 produced on the flexible substrate 102 and located in the first region 1021; and a peripheral circuit 104 produced on the flexible substrate 102 and located in the second region 1022.

In an example, the flexible substrate 102 is made of a flexible material, thus the second region 1022 and the part of the first region 1021 of the flexible substrate 102 which are not supported by the glass substrate 101 under them may bend upwardly and downwardly with respect to the glass substrate or the first region 1021 of the flexible substrate 102 in entirety is supported by the glass substrate while the second region 1022 that is not supported by the glass substrate 101 may bend upwardly and downwardly with respect to the glass substrate.

When the display panel is assembled, the second region 1022 and such as the peripheral circuit produced thereon, the driving chip and/or the flexible circuit board bend to the backside of the display screen of the display panel to achieve production of the display panel with a narrow frame.

When the flexible substrate 102 bends, in order to prevent the circuit thereon from being destroyed, the flexible substrate cannot be folded directly at right angle. Instead, it only can bend at a curvature in the folding location. In this way, if only the second region 1022 of the flexible substrate 102 bends, the part of the peripheral circuit on the second region 1022 will necessarily be located at an edge of the display screen. Thus, the assembled display screen must have a narrow frame. Thus, in order to achieve the production of display panel without frame, the edge portion of the first region 1021 and the part of the display array 103 thereon and the second region 1022 and such as the peripheral circuit produced thereon, the driving chip and/or the flexible circuit board bend to the backside of the display screen of the display panel to achieve production of the display panel with a narrow frame.

As an example, the first region 1021 is supported by the glass substrate 101. The glass substrate 101 may be totally supported on the lower surface of the first region 1021, that is, the first region 1021 is overlapped totally with the glass substrate 101 and only the second region 1022 bends when producing the display panel to achieve production of the display panel with a narrow frame. The glass substrate 101 may also be supported only on a middle part of the first region 1021, such that the edge portion of the first region 1021 can be a flexible bendable region, which may bend to the backside of the display screen along with the second region 1022 so as to produce a display panel without frame.

When the display panel without frame is produced, it needs a less width of an edge area of the first region 1021 produced by the glass substrate. The value of the width may be provided as required in practical process.

As an example, the second region 1022 has at least one discontinuous area 1023 which contributes to bending of the second region 1022 of the flexible substrate 102 to the backside of the display screen. The discontinuous area 1023, which may be an opening formed in the second region of the flexible substrate 102, may be provided at the extending positions of four corners of the glass substrate 101. The opening has a shape of right angled quadrilateral formed by crossing extensions of two adjacent sides of the glass substrate 101, or it may be only a fracture formed by cutting the second region.

As an example, the flexible substrate 102 is produced on the glass substrate 101 by coating or attaching. The flexible substrate 102 may comprise flexible insulation material, which may be one or more of polyimide, polycarbonate, polyethylene glycol terephthalate, polyarylester, polyether sulphone, or polyethylene naphthalate or the combination thereof.

As an example, the display array 103 may be a thin film transistor (TFT) display array.

As an example, the peripheral circuit 104 includes such as an array of scan lines, an array of data lines and other circuits extending to the external of the display array. The array of scan lines is produced on the left side and/or right side of the array substrate. The array of data lines is produced on the upper side and/or lower side of the array substrate. Certainly, the positions of the array of scan lines and the array of data lines are not limited to the above arrangement. They may be arranged selectively as required.

As an example, the array substrate further has a releasing layer located between the glass substrate 101 and the flexible substrate 102. The releasing layer comprises a material which is able to gasify by absorbing laser energy. In this way, when the glass substrate 101 is cut, the portion to be cut is irradiated by a laser. After the releasing layer gasifies by laser irradiation, the glass substrate 101 and the flexible substrate 102 at the location to be irradiated by the laser may be separated conveniently from each other.

The releasing layer may be made from one or more of poly(p-xylene), metal oxide, SINx, SiO$_2$, amorphous silicon, III and V Group semiconductor, or hexamethyl disilazane or the combination thereof.

As an example, the array substrate is further provided with a flexible circuit board 105 and a driving chip 106. The flexible circuit board 105 is partly arranged at an edge of the second region 1022 of the flexible substrate 102. The driving chip 106 is arranged in the second region 1022 of the flexible region 102 and electrically connected to the peripheral circuit 104. The driving chip 106 is connected to the flexible circuit board 105 by wires. The driving chip 106 includes a data driving chip and a scan driving chip that output a data signal and a scan signal to the array of data lines and the array of scan lines of the peripheral circuit respectively. Another part of the flexible circuit board 105 is connected to the printed circuit board 107.

As an example, the array substrate is further provided with a flexible circuit board 105 on which the driving chip 106 is arranged. The flexible circuit board 105 is partly arranged at an edge of the second region 1022 of the flexible substrate 102 and is electrically connected to the peripheral circuit 104.

In the above array substrate in the present disclosure, the peripheral circuit is produced in the second region other than the first region (i.e., the display region formed with the display array) of the flexible substrate and the glass substrate below the second region is removed. On the basis of the bendability of the glass substrate, when the display panel is produced, the second region of the flexible panel may bend downwardly or upwardly to the backside of the display screen so as to achieve a display apparatus with a super narrow frame, even without frame.

The present disclosure also provides a display substrate comprising the array substrate as described above.

The present disclosure also provides a display apparatus comprising the display substrate as described above.

Figure 2:
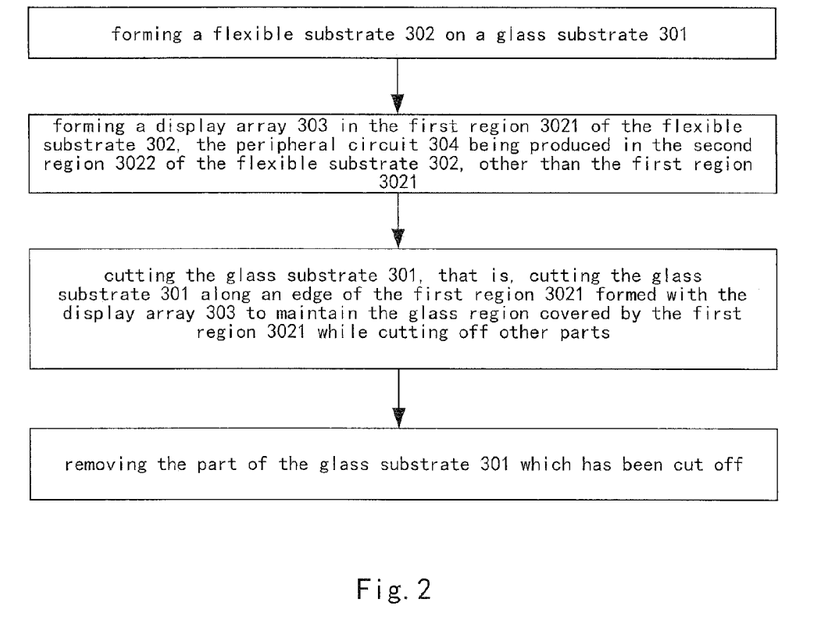
FIG. 2 is a flow chart of a method for producing the array substrate in the present disclosure.
Figure 3:
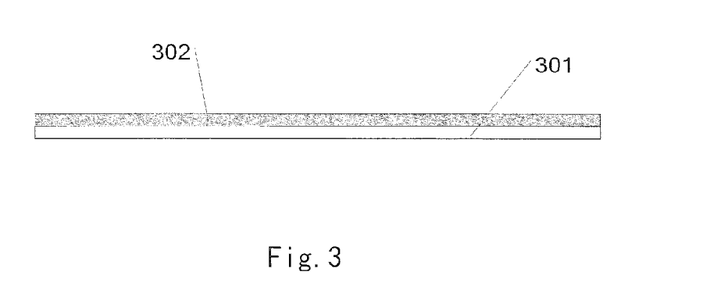
FIG. 3, FIG. 4(A)-FIG. 4(B) and FIG. 5(A)-FIG. 5(B) are flow charts of a process for producing the array substrate in the present disclosure.

FIG. 2 is a flow chart of a method for producing the array substrate in the present disclosure. FIG. 3, FIG. 4(A)-FIG. 4(B) and FIG. 5(A)-FIG. 5(B) are flow charts of a process for producing the array substrate in the present disclosure. As illustrated in FIG. 2, FIG. 3, FIG. 4(A)-FIG. 4(B) and FIG. 5(A)-FIG. 5(B), the method comprises:

Step 201 of forming a flexible substrate 302 on a glass substrate 301, seen in FIG. 3, as an example, the flexible substrate 302 may be produced by coating or attaching.

Figure 4A:
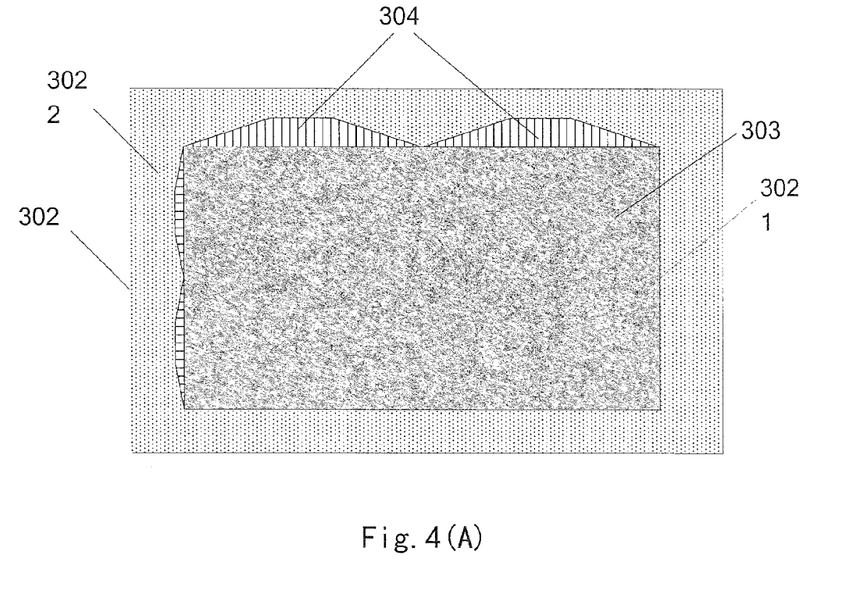
Figure 4B:
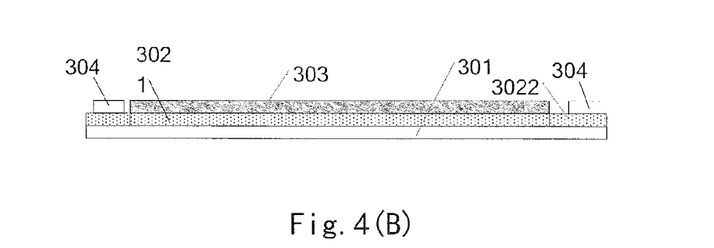

Step 202 of forming a display array 303 and a peripheral circuit 304 on the flexible substrate 302, the display array 303 being produced in the first region 3021 of the flexible substrate 302, the peripheral circuit 304 being produced in the second region 3022 of the flexible substrate 302, the second region 3022 being the region other than the first region 3021 and being located at periphery of the first region 3021, as shown in FIG. 4(A), FIG. 4(B).

As an example, the peripheral circuit 304 includes an array of scan lines, an array of data lines and other circuits. The array of scan lines is produced on the left side and/or right side of the array substrate. The array of data lines is produced on the top side and/or bottom side of the array substrate. Certainly, the positions of the array of scan lines and the array of data lines are not limited to the above embodiments. Instead, they may be provided as required in practice.

Step 203 of cutting the glass substrate 301, that is, cutting the glass substrate 301 along an edge of the first region 3021 formed with the display array 303 to maintain the glass region covered by the first region 3021 while cutting off other parts.

As an example, upon cutting, the part of the glass substrate 301 totally overlapped with the first region 3021 may be maintained while other parts are cut off so as to achieve the production of the display panel with the narrow frame.

As an example, upon cutting, the part of the glass substrate 301 covered by the first region 3021 and supported by a middle location of the first region 3021 such that the part of the glass substrate at an edge portion of the first region 3021 of the flexible substrate 302 can be cut off to achieve the production of the display panel without the frame.

As an example, in the Step 203, the undesired part of the glass substrate is cut off by a laser cutter or a block wheel mechanism along a cutting position.

Figure 5A:
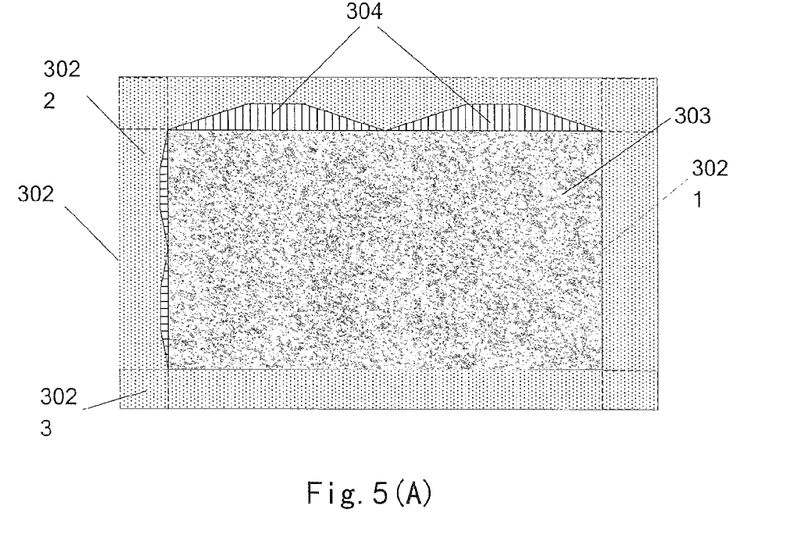
Figure 5B:
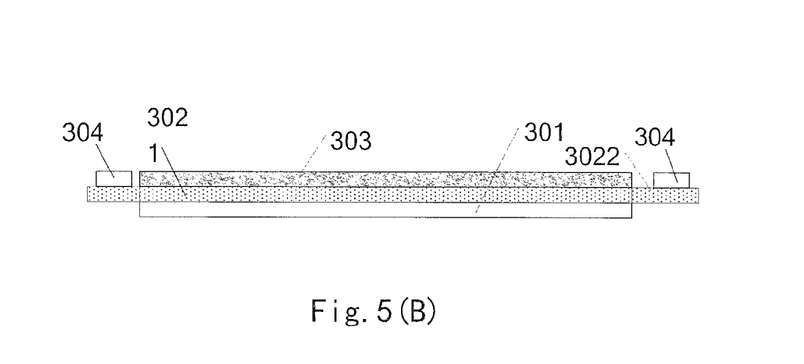

Step 204 of removing the part of the glass substrate 301 which has been cut off, as shown in FIG. 5(A), FIG. 5(B).

As an example, in the step, the part of the glass substrate 301 to be cut off may be irradiated by ultraviolet ray such that the attached locations of the glass substrate 301 and the flexible substrate 302 at the irradiated region become gas so as to separate the part of the glass substrate 301 to be cut off from the flexible substrate 302.

As an example, the method further includes: before forming the flexible substrate 302, forming a releasing layer on the glass substrate 301. Subsequently, in order to separate the glass substrate to be cut off from the flexible substrate conveniently, the releasing layer may be produced on the glass substrate 301, and then the flexible substrate 302 is produced on the releasing layer. The releasing layer 302 comprises a material which is able to gasify by absorbing laser energy. The material becomes a gas by irradiation of laser such that the flexible substrate is separated from the glass substrate. The releasing layer may be formed on an entire surface of the glass substrate 301, or only formed on a surface of the part of the glass substrate to be cut off.

The releasing layer may be produced by a method such as PVD, CVD, coating. Its material may be selected from one or more of poly(p-xylene), metal oxide, SiNx, SiO$_2$, amorphous silicon, III and V Group semiconductor, or hexamethyl disilazane or the combination thereof.

As an example, the method further comprises:

after the Step 203, cutting the part in which the peripheral circuit is not produced on the second region 3022 of the flexible substrate 302 to form at least one discontinuous area 3023 on the second region 3022, as illustrated in FIG. 5(A). The discontinuous area 3023 cut out is intended to facilitate the second region 3022 of the flexible substrate 302 to bend to the backside of the display screen when the display panel is produced.

As an example, the corner region on the second region 3022 may be cut to form a discontinuous area which may have arbitrary patterns. The discontinuous area is intended to allow the second region 3022 of the flexible substrate 302 to bend conveniently in the subsequent assembling process. For example, the corner of the second region 3022 may be cut along the extension lines of two sides of the first region 3021 so as to cut out the discontinuous area as a right angled quadrilateral.

As an example, the method further comprises:

after finishing the display array 303 and the peripheral circuit 304, providing the driving chip on the second region of the flexible substrate 302, and providing a part of the flexible circuit board at an edge of the second region of the flexible substrate 302 and electrically connecting the driving chip with the peripheral circuit 304. The driving chip includes a scan driving chip and a data driving chip.

As an example, the method further includes: after finishing the display array 303 and the peripheral circuit 304, providing a part of the flexible circuit board at an edge of the second region of the flexible substrate 302, the flexible circuit board being provided with a driving chip thereon, the driving chip being electrically connected with the peripheral circuit 304.

In the method for producing the array substrate proposed in the present disclosure, a layer of flexible substrate is produced on the glass substrate, and a display array and a peripheral circuit are produced on the flexible substrate, and a driving chip, a flexible circuit board are also arranged on the flexible substrate, then the part of the glass substrate below the flexible substrate region on which the peripheral circuit is produced and the driving chip and the flexible circuit board are provided may be cut off. In this way, when the display panel is assembled, the flexible substrate region on which the peripheral circuit is produced and the driving chip and the flexible circuit board are provided may bend to the backside of the display screen, such that the production of a display apparatus with a super narrow frame, even without frame can be achieved.

The above embodiments are optimum technical solutions instead of sole one. All of embodiments of the present invention may be implemented by using different materials, process parameters and apparatuses on the basis of the requirements of different production lines.

The objects, solutions and benefits of the present disclosure have been explained with reference to the above embodiments. It should be understood that the above embodiments are only used to explain the present disclosure, instead of limiting the present invention. Any modifications, equivalents, changes and so on within the spirit and principle of the present invention should fall within the protection scope of the present invention.

What is claimed is:

1. An array substrate comprising:
   a glass substrate;
   a flexible substrate comprising a first region and a second region, the glass substrate being arranged on a lower surface of the first region of the flexible substrate, the second region projecting from the first region towards the external of the glass substrate, and the second region of the flexible substrate being provided with a peripheral circuit thereon; and
   a display array formed on the first region of the flexible substrate,
   wherein the array substrate is further provided with a flexible circuit board which is partly attached to an edge of the second region of the flexible substrate, the flexible circuit board being provided with a driving chip thereon, the driving chip being electrically connected to the peripheral circuit.

2. The array substrate according to claim 1, wherein the first region of the flexible substrate is overlapped totally with the glass substrate and the second region of the flexible substrate bends with respect to the glass substrate.

3. The array substrate according to claim 1, wherein the glass substrate supports a middle part of the flexible substrate, and an edge portion of the first region and the second region of the flexible substrate bend with respect to the glass substrate.

4. The array substrate according to claim 1, wherein the part in which the peripheral circuit is not produced on the second region of the flexible substrate has at least one discontinuous area.

5. The array substrate according to claim 4, wherein the at least one discontinuous area is located at extending positions of four corners of the glass substrate.

6. The array substrate according to claim 5, wherein the at least one discontinuous area has a shape of right angled quadrilateral formed by crossing extensions of two adjacent sides of the glass substrate.

7. The array substrate according to claim 4, wherein the at least one discontinuous area has a shape of right angled quadrilateral formed by crossing extensions of two adjacent sides of the glass substrate.

8. The array substrate according to claim 1, wherein the flexible substrate comprises one or more of polyimide, polycarbonate, polyethylene glycol terephthalate, polyarylester, polyether sulphone, or polyethylene naphthalate or the combination thereof.

9. The array substrate according to claim 1, further comprising:
   a releasing layer located between the glass substrate and the flexible substrate and comprising a material which is able to gasify by absorbing laser energy.

10. The array substrate according to claim 9, wherein the releasing layer is made from one or more of poly(p-xylene), metal oxide, $SiN_x$, $SiO_2$, amorphous silicon, III and V Group semiconductor, or hexamethyl disilazane or the combination thereof.

11. The array substrate according to claim 1, wherein the array substrate is further provided with a flexible circuit board, which is partly attached to an edge of the second region of the flexible substrate, and a driving chip, which is attached to the second region of the flexible region and electrically connected to the peripheral circuit.

12. A display substrate comprising the array substrate according to claim 1.

13. A display apparatus comprising the display substrate according to claim 12.

14. A method for producing an array substrate, the method comprising:
   forming a flexible substrate on a glass substrate;
   forming a display array and a peripheral circuit on the flexible substrate, the flexible substrate comprising a first region in which the display array is located and a second region in which the peripheral circuit is located, the second region being the region on the flexible substrate other than the first region;
   cutting the glass substrate along an edge of the first region formed with the display array;
   separating the part of the glass substrate which is not covered by the first region from the flexible substrate.

15. The method according to claim 14, further comprising: before forming the flexible substrate, forming a releasing layer on the glass substrate and forming the flexible substrate on the releasing layer, the releasing layer comprising a material which is able to gasify by absorbing laser energy.

16. The method according to claim 15, wherein the releasing layer is formed on an entire surface of the glass substrate, or only formed on a surface of the part of the glass substrate to be cut off.

17. The method according to claim 14, wherein the part of the glass substrate which is not covered by the first region from the flexible substrate is separated by means of laser irradiation.

18. The method according to claim 14, further comprising: cutting the part in which the peripheral circuit is not produced on the second region of the flexible substrate to form at least one discontinuous area on the second region.

* * * * *